(12) United States Patent
Lee

(10) Patent No.: US 10,191,797 B2
(45) Date of Patent: Jan. 29, 2019

(54) ELECTRONIC SYSTEM GENERATING MULTI-PHASE CLOCKS AND TRAINING METHOD THEREOF

(71) Applicant: SK hynix Inc., Icheon-si, Gyeonggi-do (KR)

(72) Inventor: Hyun Woo Lee, Icheon-si (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 519 days.

(21) Appl. No.: 14/476,340

(22) Filed: Sep. 3, 2014

(65) Prior Publication Data

US 2015/0364176 A1    Dec. 17, 2015

(30) Foreign Application Priority Data

Jun. 12, 2014 (KR) .................. 10-2014-0071257

(51) Int. Cl.
*G06F 1/00* (2006.01)
*G06F 11/07* (2006.01)
*G11C 7/22* (2006.01)
*G11C 29/02* (2006.01)

(52) U.S. Cl.
CPC ............ *G06F 11/079* (2013.01); *G11C 7/222* (2013.01); *G11C 29/022* (2013.01); *G11C 29/023* (2013.01); *G11C 29/028* (2013.01)

(58) Field of Classification Search
None
See application file for complete search history.

(56) References Cited

U.S. PATENT DOCUMENTS

| 6,029,250 | A | * | 2/2000 | Keeth | ..................... G06F 5/06 711/167 |
| 8,631,266 | B2 | | 1/2014 | Seol et al. | |
| 9,691,447 | B2 | * | 6/2017 | Shaeffer | ............... G11C 7/1063 |
| 2003/0070052 | A1 | * | 4/2003 | Lai | ..................... G06F 13/1694 711/167 |
| 2007/0177700 | A1 | * | 8/2007 | Saeki | ................... H03L 7/0814 375/371 |
| 2007/0206428 | A1 | * | 9/2007 | Bae | ...................... G11C 7/1051 365/193 |
| 2009/0039927 | A1 | * | 2/2009 | Gillingham | ......... G06F 13/1694 327/156 |
| 2009/0238025 | A1 | * | 9/2009 | Shaeffer | ............. G06F 13/1689 365/233.1 |
| 2010/0054059 | A1 | * | 3/2010 | Yoon | ..................... G11C 7/1072 365/194 |
| 2010/0054073 | A1 | * | 3/2010 | Park | ..................... G11C 7/1072 365/233.1 |

(Continued)

FOREIGN PATENT DOCUMENTS

KR    1020130032505 A    4/2013

*Primary Examiner* — Nitin C Patel
(74) *Attorney, Agent, or Firm* — William Park & Associates Ltd.

(57) ABSTRACT

An electronic system includes a memory controller and a memory. The memory controller generates a plurality of controller clocks having different phases from one another based on a reference clock signal. The memory generates a plurality of internal clocks having different phases from one another by receiving first and second clocks having a phase difference from each other, and outputs one of odd-ordered data and even-ordered data in synchronization with the plurality of internal clocks.

15 Claims, 11 Drawing Sheets

(56) References Cited

U.S. PATENT DOCUMENTS

| | | | |
|---|---|---|---|
| 2010/0165758 A1* | 7/2010 | Park | G11C 7/1006 |
| | | | 365/193 |
| 2011/0050294 A1* | 3/2011 | Park | G06F 1/08 |
| | | | 327/115 |
| 2011/0158030 A1* | 6/2011 | Bae | G11C 7/22 |
| | | | 365/233.1 |
| 2011/0235459 A1* | 9/2011 | Ware | G11C 7/04 |
| | | | 365/233.11 |
| 2011/0243289 A1* | 10/2011 | Seol | G11C 7/22 |
| | | | 375/371 |
| 2011/0267117 A1* | 11/2011 | Choi | H03L 7/00 |
| | | | 327/156 |
| 2012/0062291 A1* | 3/2012 | Saitoh | H04L 7/033 |
| | | | 327/157 |
| 2012/0195153 A1* | 8/2012 | Kwon | G11C 7/1066 |
| | | | 365/233.11 |
| 2012/0242385 A1* | 9/2012 | Tokuhiro | G06F 13/1689 |
| | | | 327/158 |
| 2013/0151796 A1* | 6/2013 | Gupta | G06F 13/12 |
| | | | 711/154 |
| 2013/0208818 A1* | 8/2013 | Shaeffer | G06F 13/00 |
| | | | 375/259 |

* cited by examiner

ELECTRONIC SYSTEM GENERATING MULTI-PHASE CLOCKS AND TRAINING METHOD THEREOF

CROSS-REFERENCES TO RELATED APPLICATION

The present application claims priority under 35 U.S.C. § 119(a) to Korean application number 10-2014-0071257 filed on Jun. 12, 2014 in the Korean Intellectual Property Office, which is incorporated herein by reference in its entirety.

BACKGROUND

1. Technical Field

Embodiments of the present invention generally relate to an electronic apparatus, and more particularly, in one or more embodiments, to an electronic system that generates multi-phase clocks, and a method of training the same.

2. Related Art

In an electronic system in which a master apparatus such as a processor or a controller communicates with a slave apparatus such as a lower level processor (e.g., a memory controller), a data storage apparatus, or a memory, the master apparatus and the slave apparatus may communicate with each other by transmitting and receiving data to/from each other. In an electronic system where the master and slave apparatuses have asynchronous interfaces, the master apparatus transmits a clock signal to the slave apparatus so that the slave apparatus can be synchronized with the clock. Such an electronic system may control the interface between the master and slave apparatuses so that the data transmission between them may be synchronized with the clock signal.

SUMMARY

In an embodiment of the present invention, an electronic system may include a memory controller configured to generate a plurality of controller clocks having different phases from one another based on a reference clock signal, and a memory configured to generate a plurality of internal clocks having different phases from one another by receiving first and second clocks having a phase difference from each other, and to output one of odd-ordered data and even-ordered data in synchronization with the plurality of internal clocks.

In an embodiment of the present invention, an electronic system may include a memory controller configured to generate a plurality of controller clocks having different phases from one another based on a reference clock signal, and a memory configured to generate a first group of clocks and a second group of clocks having different phases from one another by receiving first and second clocks having a phase difference from each other, and to output one odd-ordered data and even-ordered data in synchronization with one of the first group of clocks and the second group of clocks.

In an embodiment of the present invention, an electronic system may include a memory controller configured to generate a plurality of controller clocks having different phases from one another based on a reference clock signal, and a memory configured to generate a plurality of internal clocks having different phases from one another by receiving first and second clocks having a phase difference from each other, and to output odd-ordered error detection information and even-ordered error detection information as an error detection code in synchronization with the plurality of internal clocks.

BRIEF DESCRIPTION OF THE DRAWINGS

Features, aspects and embodiments are described in conjunction with the attached drawings, in which.

DETAILED DESCRIPTION

Figure 1:
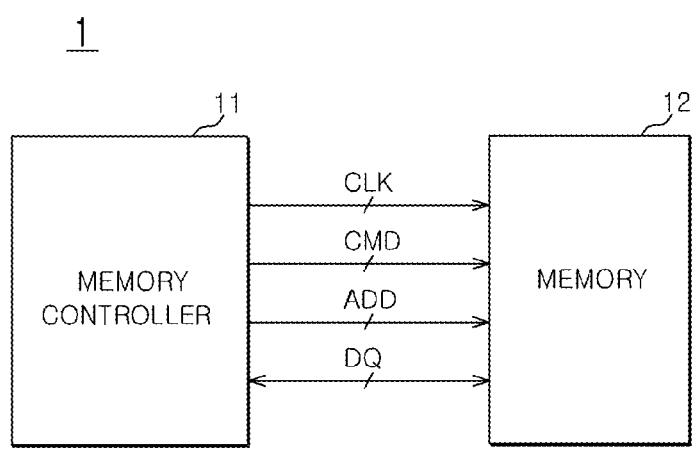
FIG. 1 is a block diagram illustrating an electronic system in accordance with an embodiment of the present disclosure.

Referring to FIG. 1, an electronic system 1 may include a memory controller 11 and a memory 12. The memory controller 11 and the memory 12 may communicate with each other by transmitting and receiving data to/from each other. The memory controller 11 may control operations that are carried out in the memory 12. For example, the memory 12 may perform write and read operations, and the memory controller 11 may control the memory to perform the write and read operations. The memory controller 11 may control the operations of the memory 12 by transmitting various control signals to the memory 12 through a plurality of system buses. For example, the memory controller 11 may provide one or more clocks CLK, a command signal CMD, an address signal ADD, and data DQ to the memory 12 through the plurality of system buses so that the memory 12 may perform the write operation for storing data in memory cells of the memory 12. Also, the memory controller 11 may provide one or more clocks CLK, a command signal CMD, an address signal ADD, and data DQ to the memory 12 through the plurality of system buses so that the memory 12 may perform the read operation for outputting data from the memory cells of the memory 12.

The memory controller 11 may be a master apparatus for controlling the memory 12. The memory controller 11 may be one of a central processing unit (CPU), a graphic processing unit (GPU), a digital signal processor (DSP), and an application processor (AP).

The memory 12 may be a volatile memory apparatus such as a dynamic random access memory (DRAM), or a nonvolatile memory apparatus such as a flash memory, a phase change random access memory (PCRAM), a resistive random access memory (ReRAM), a ferroelectric random access memory (FeRAM), a magnetic random access memory (MRAM) and a Spin Transfer Torque random access memory (STTRAM), or may comprise combination of two or more among the volatile memory apparatus and the nonvolatile memory apparatus.

Figure 2:
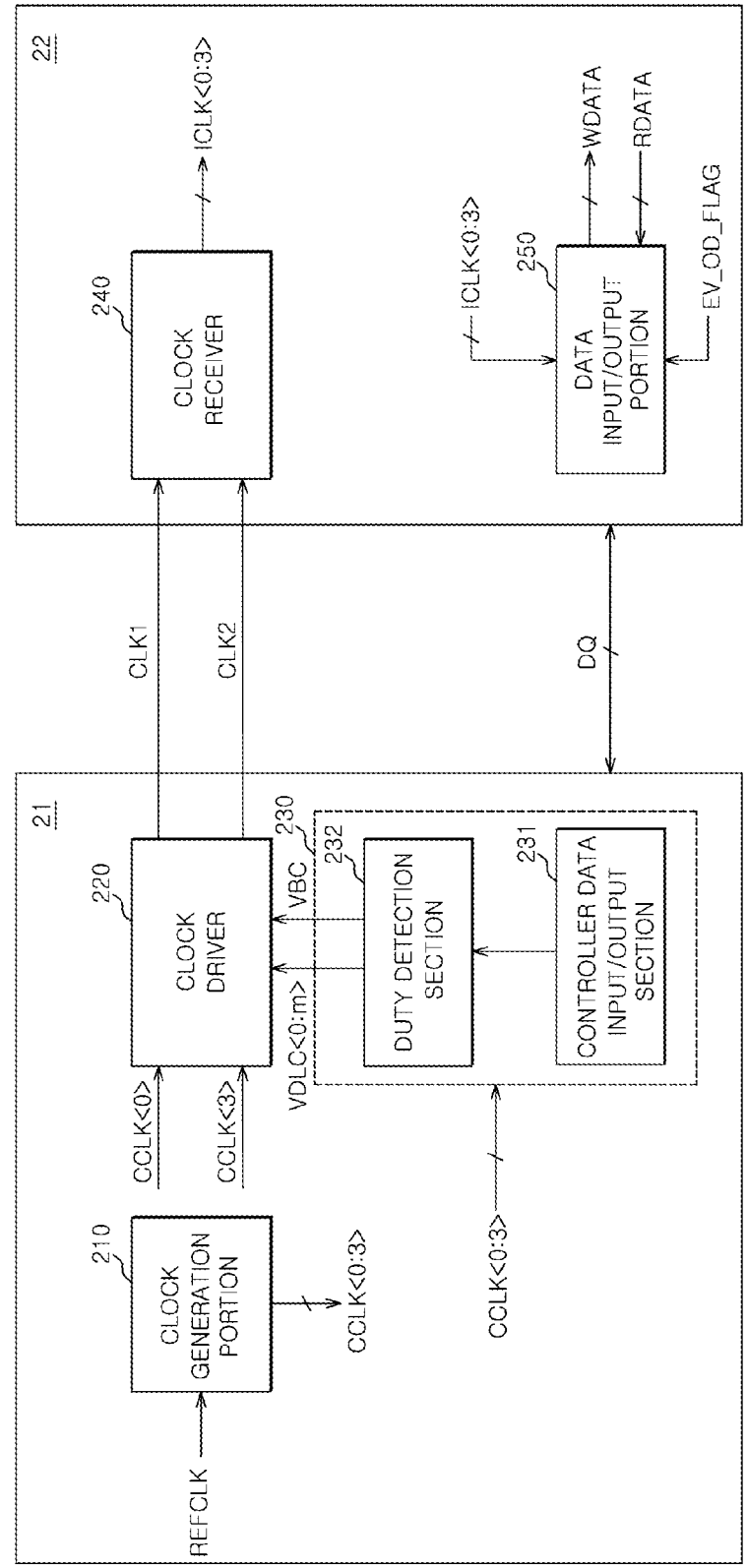
FIG. 2 is a block diagram illustrating an electronic system in accordance with an embodiment of the present disclosure.

FIG. 2 is a block diagram illustrating an electronic system 2 in accordance with an embodiment of the present disclosure. Referring to FIG. 2, the electronic system 2 may include a memory controller 21 and a memory 22. The memory controller 21 may transmit one or more clock signals. For example, the memory controller 21 may transmit first and second clocks CLK1 and CLK2 having different phases from one another to the memory 22, and the memory 22 may generate a plurality of internal clocks ICLK<0:3> having different phases from one another based on the first and second clocks CLK1 and CLK2. The first and second clocks CLK1 and CLK2 may have different phases from one another. For example, the phase difference between the first and second clocks CLK1 and CLK2 may be 90 or 270 degrees. In an embodiment of the present invention, the first and second clocks CLK1 and CLK2 may be single-ended clocks. In an electronic system in which a memory controller transmits a clock to a memory, if it is a differential clock, more than one pad and signal line may be needed to transmit a clock signal. The memory controller 21 in accordance with an embodiment of the present disclosure may transmit the first and second clocks CLK1 and CLK2, which are the single-ended clocks having the different phase from each other, to the memory 22. The memory controller 21 may generate a plurality of controller clocks CCLK<0:3> having different phases from one another based on a reference clock REFCLK. The memory controller 21 may transmit two or more clocks between the plurality of controller clocks CCLK<0:3>. For example, the memory controller 21 may transmit first and fourth controller clocks CCLK<0> and CCLK<3> to the memory 22 as the first and second clocks CLK1 and CLK2. The reference clock REFCLK may be generated by a clock generation circuit, which may include a phase locked loop. The memory controller 21 may include the clock generation circuit therein. Also, the clock generation circuit may exist outside the memory controller 21.

The memory 22 may receive the first and second clocks CLK1 and CLK2 from the memory controller 21, and generate the plurality of internal clocks ICLK<0:3> having different phases from one another based on the first and second clocks CLK1 and CLK2. The memory 22 may perform various operations in response to the plurality of internal clocks ICLK<0:3>, and for example, the memory 22 may perform data write and data read operations in response to the plurality of internal clocks ICLK<0:3>. Hereinafter, a plurality of data may be referred to as read data RDATA and write data WDATA. The read data RDATA may be outputted from the memory 22 during the read operation, and the write data WDATA may be stored in the memory 22 during the write operation. The memory 22 may output the read data RDATA to the memory controller 21 in response to the plurality of internal clocks ICLK<0:3>. The memory 22 may output part of the plurality of data in synchronization with the plurality of internal clocks ICLK<0:3>. For example, where the plurality of data is in order, the memory 22 may output odd-ordered data synchronization with the plurality of internal clocks ICLK<0:3>. Also, the memory 22 may output even-ordered data in synchronization with the plurality of internal clocks ICLK<0:3>. When the memory 22 operates with double data rate (DDR), it transfers data on both the rising and falling edges of a clock signal. For example, the memory 22 transfers the odd-ordered data on the rising edge the clock signal and the even-ordered data on the falling edge of the clock signal. The memory 22 may output data DQ having substantially the same duty ratio as the plurality of internal clocks ICLK<0:3> by outputting only one of the odd-ordered data and the even-ordered data among the plurality of data in synchronization with the plurality of internal clocks ICLK<0:3>, which will be described later in more detail.

Referring to FIG. 2, the memory controller 21 may include a clock generation portion 210, a clock driver 220, and a training portion 230. The clock generation portion 210 may receive the reference clock REFCLK, and generate the plurality of controller clocks CCLK<0:3>. The plurality of controller clocks CCLK<0:3> may have different phases from each other. For example, the plurality of controller clocks CCLK<0:3> may have phase difference such that the phase difference between controller clocks having consecutive numbers CCLK<n> and CCLK<n−1> is 90 degrees.

The clock driver 220 may drive and output two or more clocks between the plurality of controller clocks CCLK<0:3> as the first and second clocks CLK1 and CLK2. For example, clock driver 220 may output the first and fourth controller clocks CCLK<0> and CCLK<3> as the first and second clocks CLK1 and CLK2. The first and second clocks CLK1 and CLK2 may be transmitted to the memory 22 through a system bus. For example, the clock driver 220 may output the first controller clock CCLK<0>, and the fourth controller clock CCLK<3>, which has phase difference of 90 degrees from the first controller clock CCLK<0>, as the first and second clocks CLK1 and CLK2, respectively. The clock driver 220 may variably delay the plurality of controller clocks CCLK<0:3> in response to a variable delay code VDLC<0:m>, and may drive the plurality of controller clocks CCLK<0:3> in response to a variable power source VBC.

The training portion 230 may receive data DQ outputted from the memory 22. The training portion 230 may control the clock driver 220 based on the data DQ outputted from the memory 22. The training portion 230 may detect the duty ratio of the data DQ, generate the variable delay code VDLC<0:m> and the variable power source VBC based on result of the duty ratio detection, and provide the variable delay code VDLC<0:m> and the variable power source VBC to the clock driver 220. For example, the training portion 230 may change logic value of the variable delay code VDLC<0:m> and level of the variable power source VBC until the duty ratio of the data DQ becomes 50:50.

The training portion 230 may include a controller data input/output section 231 and a duty detection section 232. The controller data input/output section 231 may receive data outputted from the memory 22 during read operation, and transmit data to the memory 22 during write operation. The controller data input/output section 231 may transmit and receive the data in synchronization with the plurality of controller clocks CCLK<0:3>. The duty detection section 232 may receive data DQ, outputted from the memory 22, through the controller data input/output section 231. The duty detection section 232 may detect the duty ratio of data DQ outputted from the memory 22, and may generate the variable delay code VDLC<0:m> and the variable power source VBC. The duty detection section 232 may increase or decrease the logic value of the variable delay code VDLC<0:m>, and also raise or lower the level of the variable power source VBC until the duty ratio of the data DQ outputted from the memory 22 becomes 50:50.

Referring to FIG. 2, the memory 22 may include a clock receiver 240 and a data input/output portion 250. The clock receiver 240 may receive the first and second clocks CLK1 and CLK2 from the memory controller 21. The clock receiver 240 may generate the plurality of internal clocks ICLK<0:3> having different phases from one another based on the first and second clocks CLK1 and CLK2. The clock receiver 240 may generate the plurality of internal clocks ICLK<0:3> by combining the first and second clocks CLK1 and CLK2, which are the single-ended clocks.

The data input/output portion 250 may receive the data DQ transmitted from the memory controller 21, and output the write data WDATA to an internal circuit of the memory 22. Also, the data input/output portion 250 may output the read data RDATA stored in the memory 22 to the memory controller 21. The data input/output portion 250 may output the read data RDATA as the data DQ in synchronization with the plurality of internal clocks ICLK<0:3>. The data input/output portion 250 may further receive an even-odd flag EV_OD_FALG. The even-odd flag EV_OD_FALG may be generated based on a command signal or an address signal outputted from the memory controller 21. The even-odd flag EV_OD_FALG may be generated in the memory 22 as a test mode signal. The even-odd flag EV_OD_FALG may allow the read data RDATA to be selectively outputted through the data input/output portion 250. The data input/output portion 250 may output one of the odd-ordered data and the even-ordered data of the read data RDATA, in synchronization with the plurality of internal clocks ICLK<0:3>, in response to the even-odd flag EV_OD_FALG.

Figure 3:
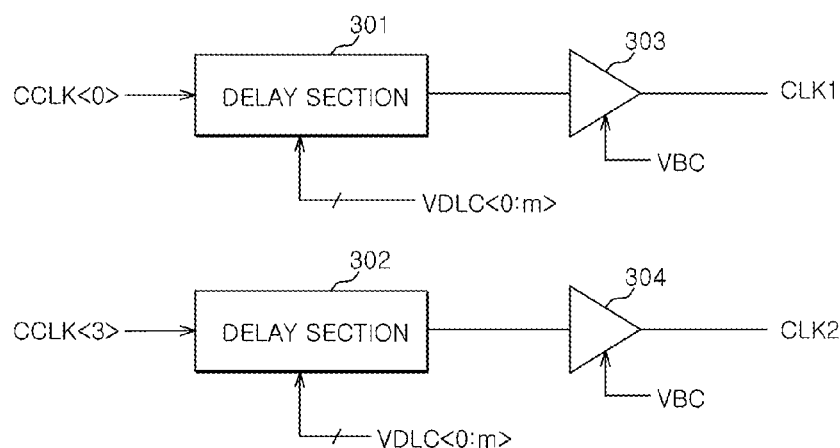
FIG. 3 is a circuit diagram illustrating a clock driver shown in FIG. 2.

FIG. 3 is a circuit diagram illustrating the clock driver 220 shown in FIG. 2. Referring to FIG. 3, the clock driver 220 may include a plurality of delay sections, for example, first and second delay sections 301 and 302, and a plurality of buffering sections, for example, first and second buffering sections 303 and 304. The first delay section 301 may receive one clock, for example, a first controller clock CCLK<0> between the plurality of controller clocks CCLK<0:3>, and delay the first controller clock CCLK<0> in response to the variable delay code VDLC<0:m>. Similarly, the second delay section 302 may receive one clock, for example, a fourth controller clock CCLK<3> between the plurality of controller clocks CCLK<0:3>, and delay the fourth controller clock CCLK<3> in response to the variable delay code VDLC<0:m>. Delay amount of the delay sections 301 and 302 may vary according to the variable delay code VDLC<0:m>.

The first buffering section 303 may receive an output signal of the first delay section 301, and generate the first clock CLK1 by driving the output signal of the first delay section 301 in response to the variable power source VBC. The buffering section 304 may receive an output signal of the second delay section 302, and generate the second clock CLK2 by driving the output signal of the second delay section 302 in response to the variable power source VBC. The buffering sections 303 and 304 may adjust amplitudes of the first and second clocks CLK1 and CLK2 according to the level of the variable power source VBC. The clock driver 220 may adjust duty ratios of the plurality of internal clocks ICLK<0:3>, which are generated by the memory 22, using the first and second delay sections 301 and 302 having delay amounts, which may vary in response to the variable delay code VDLC<0:m>, and the buffering sections 303 and 304 changing the amplitudes of the first and second clocks CLK1 and CLK2 according to the variable power source VBC.

Figure 4:
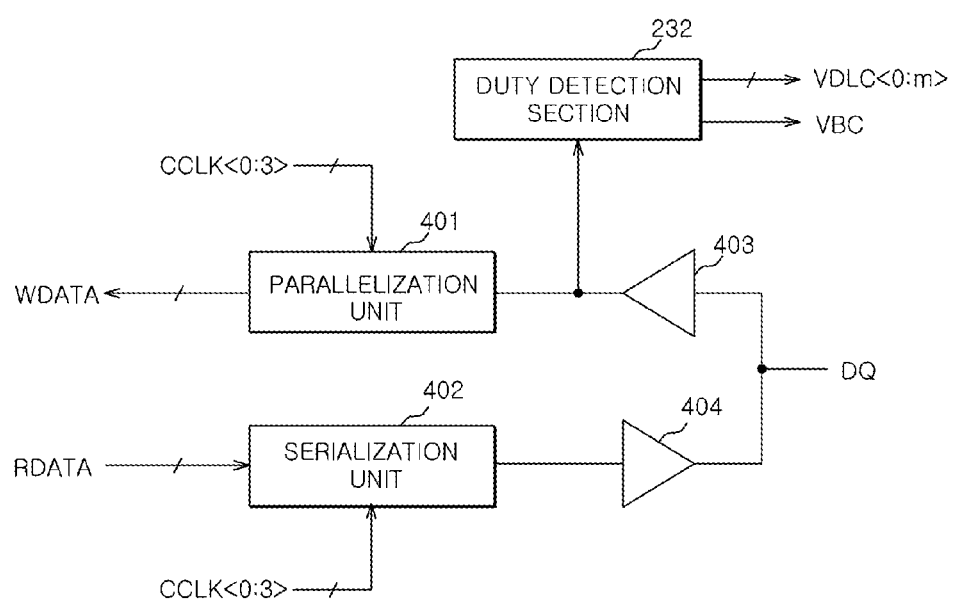
FIG. 4 is a circuit diagram illustrating a training portion shown in FIG. 2, FIGS. 5A to 5D are circuit diagrams illustrating various examples of a clock receiver shown in FIG. 2.

FIG. 4 is a circuit diagram illustrating the training portion 230 shown in FIG. 2. Referring to FIG. 2 and FIG. 4, the training portion 230 may include the controller data input/output section 231 and the duty detection section 232. The controller data input/output section 231 may include a parallelization unit 401, a serialization unit 402, and a plurality of buffers 403 and 404. The buffer 403 and the parallelization unit 401 may generate the write data WDATA by changing the data DQ, transmitted from the memory 22 through a system bus, into parallel data. The write data WDATA shown in FIG. 4 may be outputted from the memory 22 and received by the memory controller 21. The parallelization unit 401 may generate the write data WDATA based on the data DQ in response to the plurality of controller clocks CCLK<0:3>. The serialization unit 402 and the buffer 404 may generate the data DQ to transmit the read data RDATA from the memory controller 21 to the memory 22 by changing the read data RDATA into serial data (e.g., the data DQ). For example, even if each of the read data RDATA is stored in different memory cell from each other, the read data RDATA may be combined into the data DQ so as to transmit in a row through a single signal line of the system bus. The read data RDATA shown in FIG. 4 may be outputted from the memory controller 21 and received by the memory 22. The serialization unit 402 may generate the data DQ based on the read data RDATA in response to the plurality of controller clocks CCLK<0:3>.

The duty detection section 232 may receive the data DQ, which have been outputted from the memory 22 and transferred through the buffer 403. The duty detection section 232 may generate the variable delay code VDLC<0:m> and the variable power source VBC based on the data DQ. The duty detection section 232 may detect the duty ratio of the data DQ, and may increase or decrease the logic value of the variable delay code VDLC<0:m>, and also raise or lower the level of the variable power source VBC until the detected duty ratio of the data DQ becomes 50:50.

Figure 5A:
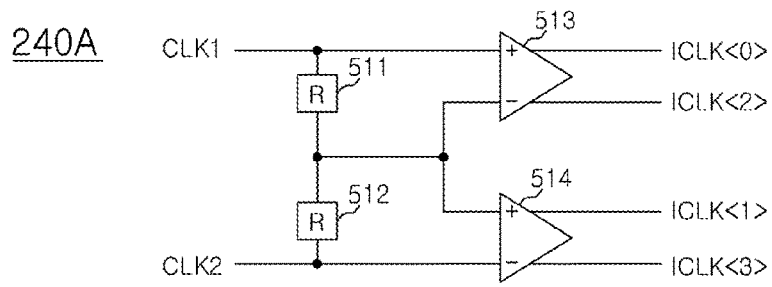

FIGS. 5A to 5D are circuit diagrams illustrating various examples of the clock receiver 240 shown in FIG. 2. Referring to FIG. 5A, a clock receiver 240A may receive first and second clocks CLK1 and CLK2, and may generate a plurality of internal clocks ICLK<0:3>. The clock receiver 240A may include a first resistance 511, a second resistance 512, a first comparator 513, and a second comparator 514. A first end of the first resistance 511 may be electrically coupled to an input node to which the first clock CLK1 is inputted and a first input terminal of the first comparator 513. A second end of the first resistance 511 may be electrically coupled to a second input terminal of the first comparator 513, and a first input terminal of the second comparator 514. A first end of the second resistance 512 may be electrically coupled to the second end of the first resistance 511. A second end of the second resistance 512 may be electrically coupled to an input node to which the second clock CLK2 is inputted and a second input terminal of the second comparator 514. The first resistance 511, the second end of which is electrically coupled to the first end of the second resistance 512, may generate a comparison voltage, a voltage level of which corresponds to average of voltage levels of the first and second clocks CLK1 and CLK2. The comparison voltage may be inputted to the second input terminal of the first comparator 513, and the first input terminal of the second comparator 514, and may serve as a comparison reference of the first and second comparators 513 and 514. Therefore, the first and second comparator 513 and 514 may generate the plurality of internal clocks ICLK<0:3> by comparing the levels of the comparison voltage and the first and second clocks CLK1 and CLK2. The plurality of internal clocks ICLK<0:3> may have phase difference such that the phase difference between internal clocks having consecutive numbers ICLK<n> and ICLK<n−1> is 90 degrees.

Figure 5B:
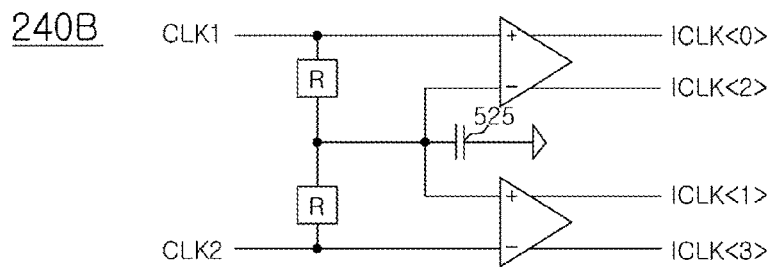

Referring to FIG. 5B, a clock receiver 240B may receive the first and second clocks CLK1 and CLK2, and may generate the plurality of internal clocks ICLK<0:3>. The clock receiver 240B may be the same as the clock receiver 240A described above with reference to FIG. 5A. Also, the clock receiver 240B may further include a capacitor 525, which is electrically coupled to the second input terminal of the first comparator 513, and the first input terminal of the second comparator 514, to which the comparison voltage is inputted. The capacitor 525 may minimize rapid level change of the comparison voltage, and therefore may allow the first and second comparator 513 and 514 to stably perform the comparison operation.

Figure 5C:
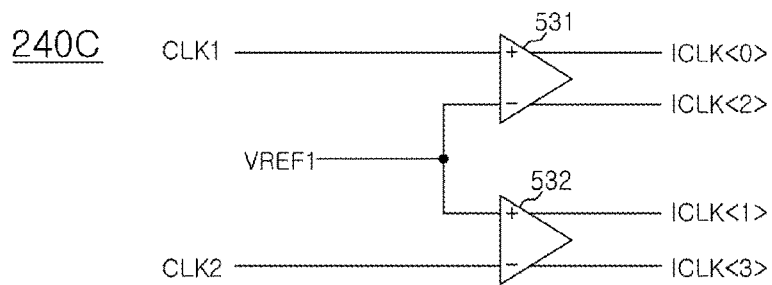

Referring to FIG. 5C, a clock receiver 240C may include third and fourth comparators 531 and 532. The clock receiver 240C may receive the first and second clocks CLK1 and CLK2, and a first voltage VREF1, and may generate the plurality of internal clocks ICLK<0:3>. The third comparator 531 may receive the first clock CLK1 at its first input terminal, and the fourth comparator 532 may receive the second clock CLK2 at its second input terminal. The third and fourth comparators 531 and 532 may receive in common the first voltage VREF1. The third comparator 531 may receive the first voltage VREF1 at its second input terminal and the fourth comparator 532 may receive the first voltage VREF1 at its first input terminals. The first voltage VREF1 may serve as a comparison reference of the third and fourth comparators 531 and 532. The first voltage VREF1 may be internally generated in the memory 22.

Figure 5D:
Figure 5D:
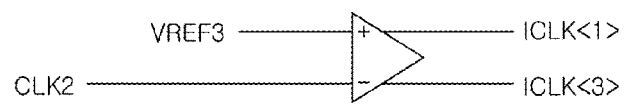

Referring to FIG. 5D, a clock receiver 240D may receive the first and second clocks CLK1 and CLK2, a second voltage VREF2, and a third voltage VREF3, and may generate the plurality of internal clocks ICLK<0:3>. Each of the second and third voltages VREF2 and VREF3 may have the same voltage level as the first voltage VREF1. The third and fourth comparators 531 and 532 shown in FIG. 5D may respectively receive the second and third voltages VREF2 and VREF3 as the comparison reference while the third and fourth comparators 531 and 532 described with reference to FIG. 5C receive in common the first voltage VREF1 as the comparison reference. The second and third voltage VREF2 and VREF3 may be internally generated in the memory 22, or may be externally provided from outside of the memory 22.

Figure 6:
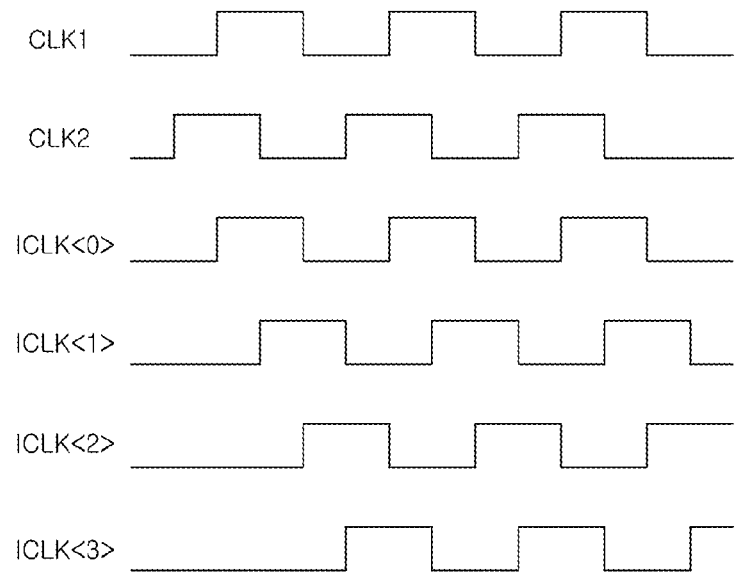
FIG. 6 is a timing diagram illustrating a plurality of internal clocks generated by a clock receiver shown in FIGS. 2 and 5.

FIG. 6 is a timing diagram illustrating the plurality of internal clocks ICLK<0:3> generated by the clock receiver 240 shown in FIGS. 2 and 5. When the clock receiver 240 receives the first clock CLK1, and the second clock CLK2, which has phase difference of 270 degrees from the first clock CLK1, the first comparator 513 of the clock receiver 240A may generate the first internal clock ICLK<0>, and the third internal clock ICLK<2>, which has phase difference of 180 degrees from the first internal clock ICLK<0>. Also, the second comparator 514 of the clock receiver 240A may generate the second internal clock ICLK<1>, which has phase difference of 90 degrees from the first internal clock ICLK<0>, and the fourth internal clock ICLK<3>, which has phase difference of 180 degrees from the second internal clock ICLK<1>, and has phase difference of 270 degrees from the first internal clock ICLK<0>. The clock receivers 240B, 240C, and 240D may output the same internal clocks ICLK<0:3> as the clock receiver 240A described above with reference to FIG. 6.

Figure 7:
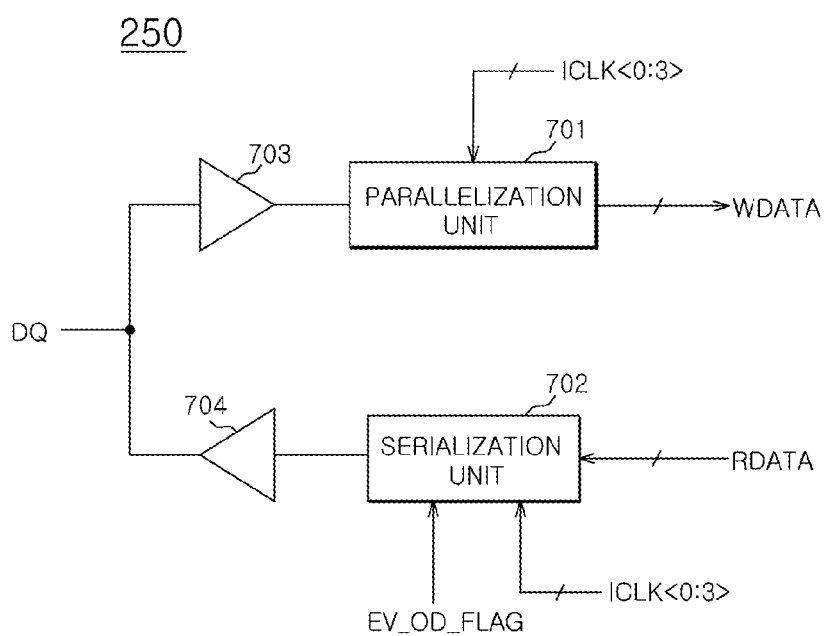
FIG. 7 is a circuit diagram illustrating a data input/output section shown in FIG. 2.

FIG. 7 is a circuit diagram illustrating the data input/output section 250 shown in FIG. 2. Referring to FIG. 7, the data input/output portion 250 may include a parallelization section 701, a serialization section 702, and a plurality of buffers 703 and 704. The data DQ transmitted between the memory controller 21 and the memory 22 through a system bus may be serial data. Also, the data stored in the memory 22 may be parallel data. For example, even if the data DQ have been transmitted, through a single signal line of the system bus, in a row, the data DQ may be divided into a number of parts so that each part of the data DQ may be stored into different memory cell from each other. The buffer 703 may receive the data DQ transmitted from the memory controller 21, and the parallelization section 701 may use the plurality of internal clocks ICLK<0:3> in order to generate the write data WDATA from the data DQ received by the buffer 703 by changing the serial data (e.g., the data DQ) transmitted from the memory controller 21 to the memory 22 into parallel data (e.g., the write data WDATA).

The serialization section 702 and the buffer 704 may output the read data RDATA as the data DQ by changing the read data RDATA, which is parallel data stored in the memory 22, into serial data. The serialization section 702 may output the read data RDATA as the data DQ in response to the plurality of internal clocks ICLK<0:3>. For example, the serialization section 702 may synchronize the read data RDATA with a rising edge of the plurality of internal clocks ICLK<0:3>, and may output the synchronized read data RDATA as the data DQ. Also, the serialization section 702 may receive the even-odd flag EV_OD_FALG. The serialization section 702 may synchronize the odd-ordered data or the even-ordered data among the read data RDATA with the plurality of internal clocks ICLK<0:3>, and output the synchronized odd-ordered or even-ordered data in response to the even-odd flag EV_OD_FALG.

Figure 8:
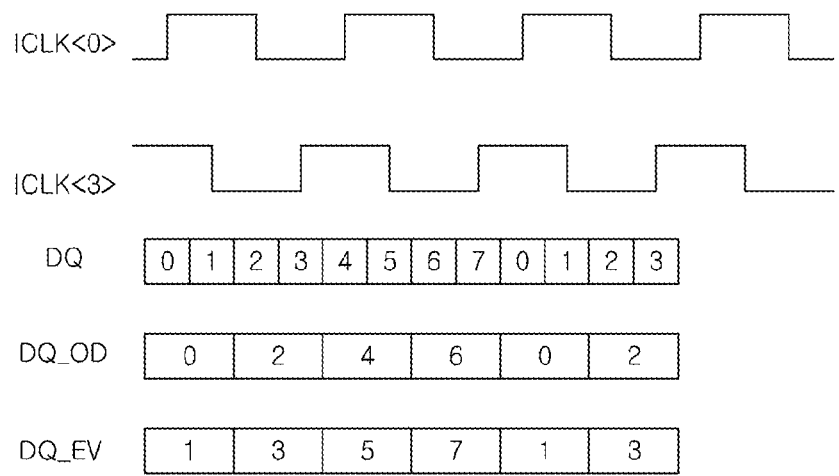
FIG. 8 is a data-timing diagram illustrating an operation of an electronic system in accordance with an embodiment of the present disclosure.

FIG. 8 is a data-timing diagram illustrating an operation of the electronic system 2 in accordance with an embodiment of the present disclosure. FIG. 8 shows the first internal clock ICLK<0>, the fourth internal clock ICLK<3>, and the outputted data DQ synchronized with edges of the plurality of internal clocks ICLK<0:3>. The data input/output portion 250 may synchronize the read data RDATA with the rising edges of the plurality of internal clocks ICLK<0:3>, and output the synchronized read data RDATA as the data DQ. Therefore, the data DQ outputted from the data input/output portion 250 may have a window corresponding to a quarter (¼) of a period of the plurality of internal clocks ICLK<0:3>. As shown in FIG. 8, the data DQ, which are sequentially outputted from the data input/output portion 250, has the window corresponding to the quarter (¼) of the period of the plurality of internal clocks ICLK<0:3>.

When the data input/output portion 250 outputs the odd-ordered data in response to the even-odd flag EV_OD_FALG, the zeroth, second, fourth, sixth, zeroth, and second data DQ_OD may be sequentially outputted, and the zeroth, second, fourth, sixth, zeroth, and second data DQ_OD may have a window corresponding to a half (½) of the period of the plurality of internal clocks ICLK<0:3>. Similarly, when the data input/output portion 250 outputs the even-ordered data in response to the even-odd flag EV_OD_FALG, the first, third, fifth, seventh, first, and third data DQ_EN may be sequentially outputted, and the first, third, fifth, seventh, first, and third data DQ_EN may have the window corresponding to a half (½) of the period of the plurality of internal clocks ICLK<0:3>.

The duty detection section 232 of the memory controller 21 may receive the data DQ transmitted from the memory 22, and may detect the duty ratio of the data DQ. When the data input/output portion 250 outputs the odd-ordered data or the even-ordered data, the data DQ may have the window corresponding to a half (½) of the period of the plurality of internal clocks ICLK<0:3>. Therefore, the duty ratio of the data DQ may be substantially the same as the plurality of internal clocks ICLK<0:3>. The duty detection section 232 may determine the duty ratio of the plurality of internal clocks ICLK<0:3> by detecting the duty ratio of the data DQ instead of the duty ratio of the plurality of internal clocks ICLK<0:3>.

Figure 9:
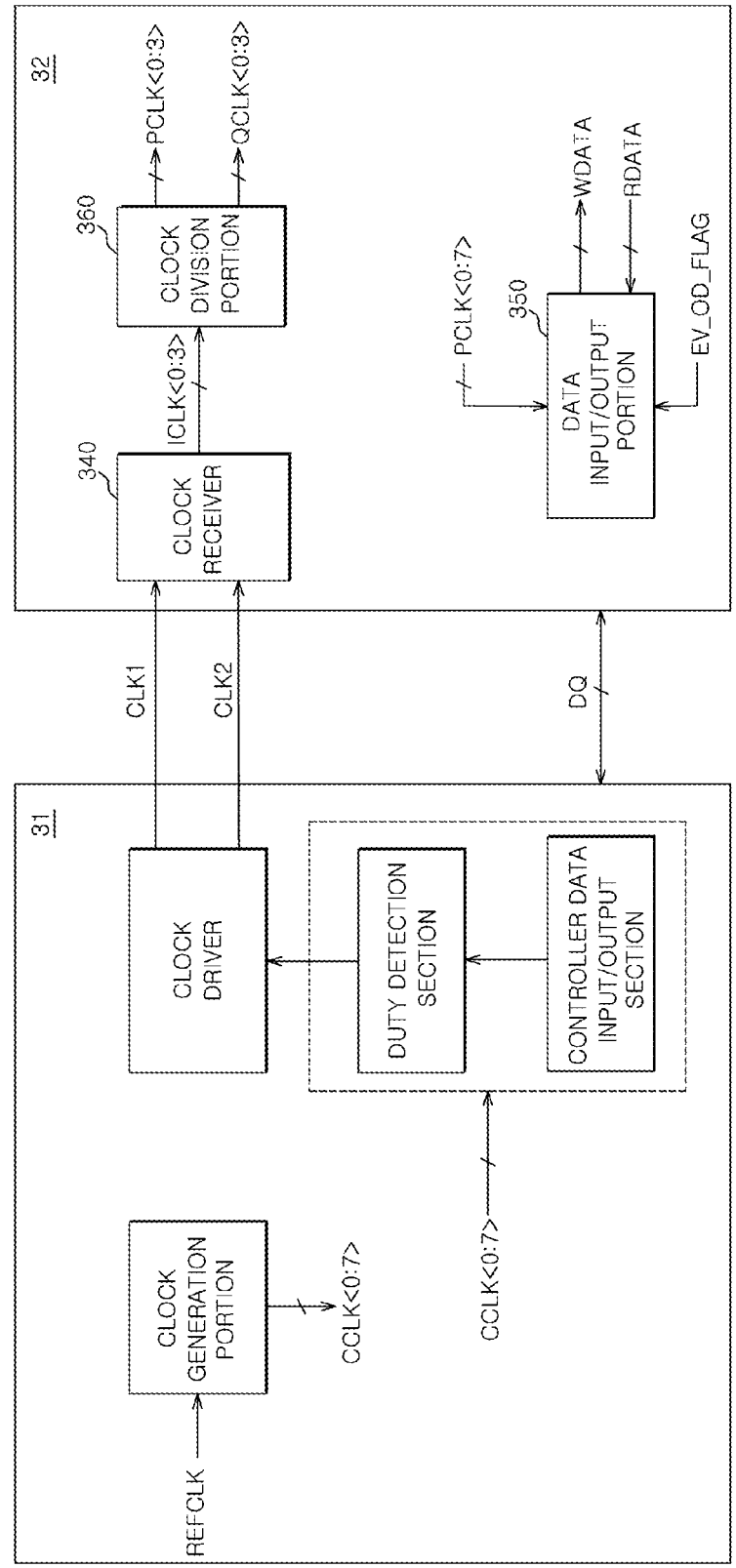
FIG. 9 is a block diagram illustrating an electronic system in accordance with an embodiment of the present disclosure.

FIG. 9 is a block diagram illustrating an electronic system 3 in accordance with an embodiment of the present disclosure. Referring to FIG. 9, the electronic system 3 may include a memory controller 31 and a memory 32. The memory controller 31 and the memory 32 may be the same as the memory controller 21 and the memory 22 described above with reference to FIGS. 2 to 8, respectively. However, in an embodiment of the present disclosure referring to FIG. 9, the number the internal clocks that the memory 32 may generate is different from that of the memory controller 21 and the memory 22 described above with reference to FIGS. 2 to 8. Referring to FIG. 9, the memory 32 may generate internal clocks ICLK<0:7> based on the first and second clocks CLK1 and CLK2, and the memory controller 31 may generate controller clocks CCLK<0:7>.

Referring to FIG. 9, the memory 32 may include a clock receiver 340, a data input/output portion 350, and a clock division portion 360. The clock receiver 340 and the data input/output portion 350 may be substantially the same as the clock receiver 240 and the data input/output portion 250 described above with reference to FIGS. 2 to 8. The clock division portion 360 may generate first and second groups of clocks PCLK<0:3> and QCLK<0:3> by dividing the plurality of internal clocks ICLK<0:3> generated by the clock receiver 340. The clock division portion 360 may generate clocks each having phases of 0, 45, 90, 135, 180, 225, 270, and 315 degrees, respectively, by dividing the plurality of internal clocks ICLK<0:3>. For example, the first group of clocks PCLK<0:3> may include the clocks having the phases of 0, 90, 180, and 270 degrees, and the second group of clocks QCLK<0:3> may include the clocks having the phases of 45, 135, 225, and 315 degrees. The memory 32 may generate the clocks having various phases to be used in internal circuits of the memory 32 by further including the clock division portion 360.

Figure 10:
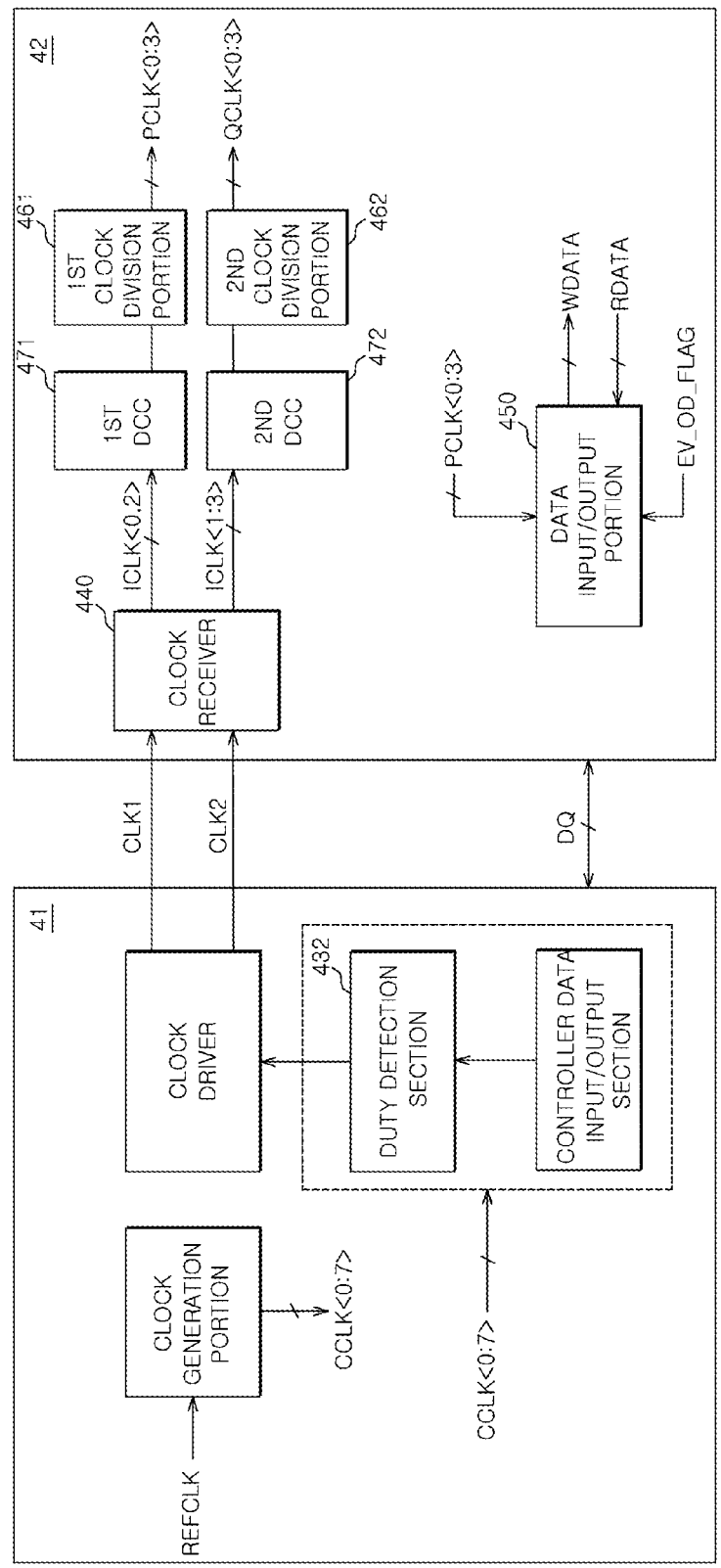
FIG. 10 is a block diagram illustrating an electronic system in accordance with an embodiment of the present disclosure.

FIG. 10 is a block diagram illustrating an electronic system 4 in accordance with an embodiment of the present disclosure. Referring to FIG. 10, the electronic system 4 may include a memory controller 41 and a memory 42, and its configuration may be similar to that of the electronic system 3 described above with reference to FIG. 9. In an embodiment of the present invention, the electronic system 4 shown in FIG. 10 may further include a plurality of clock division portions and a plurality of duty cycle correction (DCC) portions. The clock receiver 440 may receive the first and second clocks CLK1 and CLK2, and generate the plurality of internal clocks ICLK<0:3>. For example, first and third internal clocks ICLK<0> and ICLK<2> between the plurality of internal clocks ICLK<0:3> may inputted to the first duty cycle correction portion 471, and second and fourth internal clocks ICLK<1> and ICLK<3> between the plurality of internal clocks ICLK<0:3> may be inputted to the second duty cycle correction portion 472. The duty of the first and third internal clocks ICLK<0> and ICLK<2> may be corrected by the first duty cycle correction portion 471, and then the first and third internal clocks ICLK<0> and ICLK<2> may be inputted to the first clock division portion 461. The first clock division portion 461 may generate the first group of clocks PCLK<0:3> by dividing output of the first duty cycle correction portion 471. Similarly, the duty of the second and fourth internal clocks ICLK<1> and ICLK<3> may be corrected by the second duty cycle correction portion 472, and then the second and fourth internal clocks ICLK<1> and ICLK<3> may be inputted to the second clock division portion 462. The second clock division portion 462 may generate the second group of clocks QCLK<0:3> by dividing output of the second duty cycle correction portion 472. The data input/output portion 450 may synchronize the read data RDATA with the first group of clocks PCLK<0:3>, and output the synchronized read data RDATA as the data DQ.

The memory 42 of the electronic system 4 may correct the duties of the plurality of internal clocks ICLK<0:3> and then may generate the first and second groups of clocks PCLK<0:3> and QCLK<0:3> by dividing the plurality of internal clocks ICLK<0:3>, thereby generating clocks having precise duty ratios. The duty detection section 432 of the memory controller 41 may reduce the time that is taken to complete the training operation.

Figure 11:
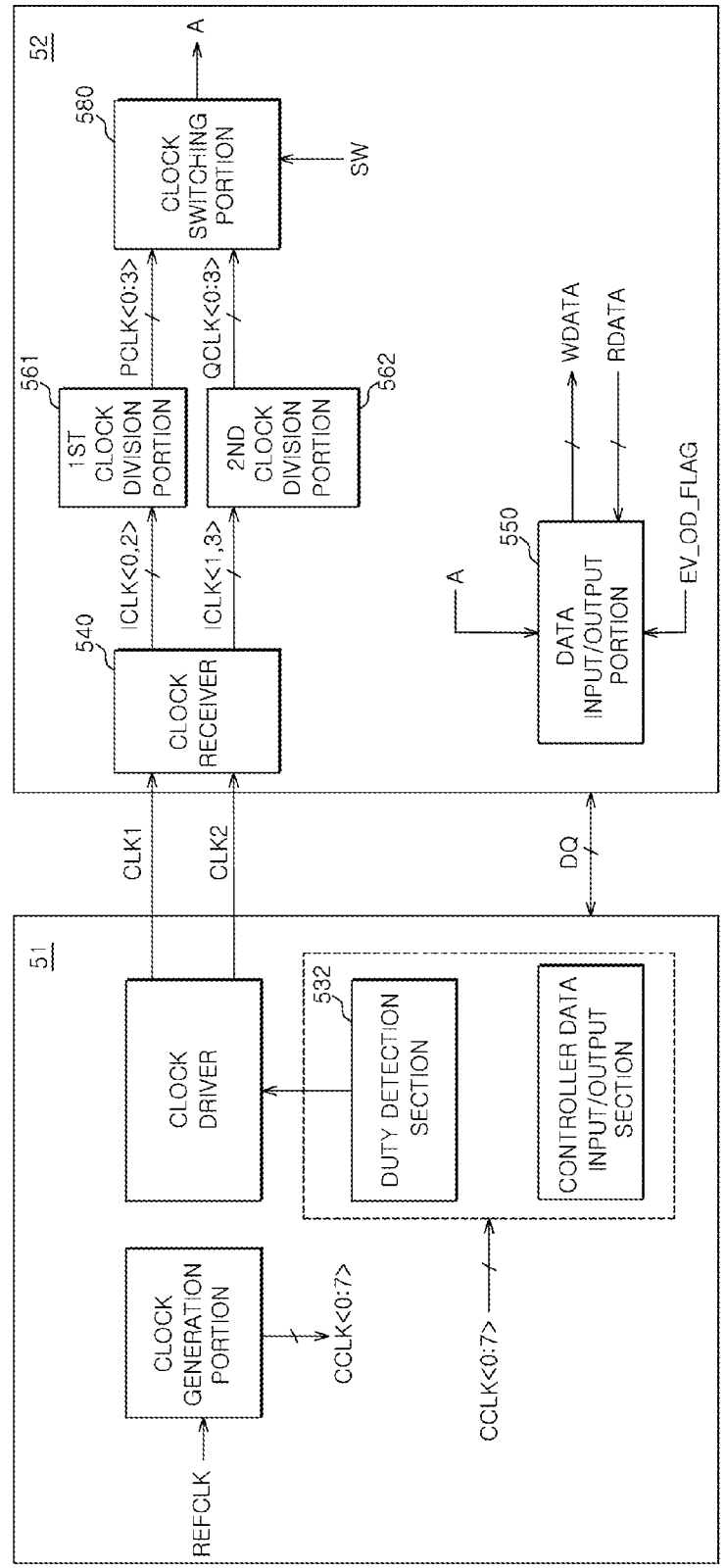
FIG. 11 is a block diagram illustrating an electronic system in accordance with an embodiment of the present disclosure.

FIG. 11 is a block diagram illustrating an electronic system 5 in accordance with an embodiment of the present disclosure. Referring to FIG. 11, the electronic system 5 may include a memory controller 51 and a memory 52, and its configuration may be similar to that of the electronic systems 3 and 4 described above with reference to FIGS. 9 and 10. In an embodiment of the present invention, the electronic system 5 shown in FIG. 11 may further include a clock switching portion 580. The clock receiver 540 may receive the first and second clocks CLK1 and CLK2, and generate the plurality of internal clocks ICLK<0:3>. The first clock division portion 561 may generate the first group of clocks PCLK<0:3> by dividing first and third internal clocks ICLK<0> and ICLK<2> between the plurality of internal clocks ICLK<0:3>. The second clock division portion 562 may generate the second group of clocks QCLK<0:3> by dividing second and fourth internal clocks ICLK<1> and ICLK<3> between the plurality of internal clocks ICLK<0:3>.

Referring to FIG. 11, the data input/output portion 450 may receive the first group of clocks PCLK<0:3>. The data input/output portion 450 may output the odd-ordered data or the even-ordered data among a plurality of data (the read data RDATA) to the memory controller 41 in response to the first group of clocks PCLK<0:3>. Referring to FIG. 11, the memory 52 of the electronic system 5 further including the clock switching portion 580 may output the plurality of data in synchronization with the second group of clocks QCLK<0:3> as well as the first group of clocks PCLK<0:3>, and may correct the duty ratios of the plurality of internal clocks ICLK<0:3> based on the second group of clocks QCLK<0:3> together with the first group of clocks PCLK<0:3>. The clock switching portion 580 may receive the first and second groups of clocks PCLK<0:3> and QCLK<0:3>, and provide one of the first and second groups of clocks PCLK<0:3> and QCLK<0:3> to the data input/output portion 550. The clock switching portion 580 may input the first group of clocks PCLK<0:3> to an input node A of the data input/output portion 550 in response to a switch control signal SW, and the data input/output portion 550 may output the odd-ordered data or the even-ordered data in synchronization with the first group of clocks PCLK<0:3>. The duty detection section 532 may correct the duty ratio of the first group of clocks PCLK<0:3> by detecting the duty ratio of the data DQ, which is substantially the same as the first group of clocks PCLK<0:3>. Also, the clock switching portion 580 may input the second group of clocks QCLK<0:3> to the input node A of the data input/output portion 550 in response to the switch control signal SW, and the data input/output portion 550 may output the odd-ordered data or the even-ordered data in synchronization with the second group of clocks QCLK<0:3>. The duty detection section 532 may correct the duty ratio of the second group of clocks QCLK<0:3> by detecting the duty ratio of the data DQ, which is substantially the same as the duty ratio of the second group of clocks QCLK<0:3>. The clock switching portion 580 may allow training operation with respect to the second group of clocks QCLK<0:3> as well as the first group of clocks PCLK<0:3>.

Figure 12:
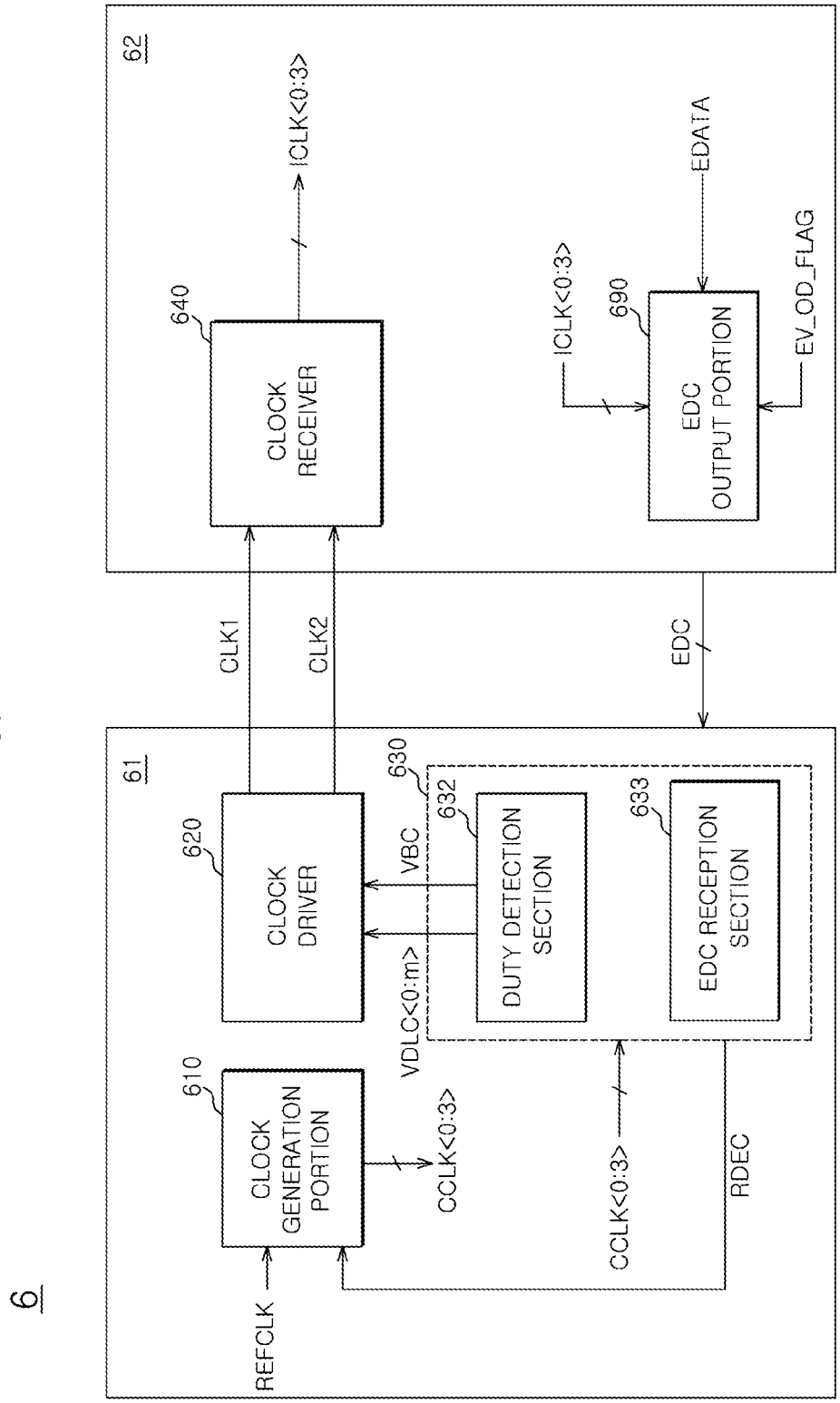
FIG. 12 is a block diagram illustrating an electronic system in accordance with an embodiment of the present disclosure.

FIG. 12 is a block diagram illustrating an electronic system 6 in accordance with an embodiment of the present disclosure. Referring to FIG. 12, the electronic system 6 may include a memory controller 61 and a memory 62. The memory controller 61 may include a clock generation portion 610, a clock driver 620, and a training portion 630. The memory 62 may include a clock receiver 640 and an EDC output portion 690. The clock receiver 640 may generate the plurality of internal clocks ICLK<0:3> in response to the first and second clocks CLK1 and CLK2 transmitted through the clock driver 620 of the memory controller 61. The EDC output portion 690 may be provided in order to transmit data error detection information EDATA, which is generated by an internal circuit of the memory 62, to the memory controller 61. Like general data signal, the data error detection information EDATA may be transmitted to the memory controller 61, and may be transmitted to the memory controller 61 through an EDC pad, which is different from a data pad for transmission of data. The data error detection information EDATA may be inputted to the EDC output portion 690. The EDC output portion 690 may synchronize the data error detection information EDATA with the plurality of internal clocks ICLK<0:3>, and output the synchronized data error detection information as an error detection code EDC to the memory controller 61. Also, the EDC output portion 690 may output odd-ordered information or even-ordered information of the data error detection information EDATA as the error detection code EDC in response to the even-odd flag EV_OD_FALG. The error detection code EDC outputted from the EDC output portion 690 in response to the even-odd flag EV_OD_FALG may have a window corresponding to a half (½) of the period of the plurality of internal clocks ICLK<0:3>. Also, duty ratio of the error detection code EDC may be substantially the same as the duty ratio of the plurality of internal clocks ICLK<0:3>.

The training portion 630 may include an EDC reception section 633 and a duty detection section 632. The EDC reception section 633 may receive the error detection code EDC transmitted from the memory 62, may synchronize the error detection code EDC with the plurality of controller clocks CCLK<0:3>, and may output the synchronized error detection code EDC to an internal circuit of the memory controller 61. In an embodiment of the present disclosure, an output signal REDC of the EDC reception section 633 may be inputted to the clock generation portion 610, and may be used for the clock generation portion 610 to correct the duty ratio of the plurality of controller clocks CCLK<0:3>. The duty detection section 632 may receive the error detection code EDC, may detect the duty ratio of the error detection code EDC, and may generate the variable delay code VDLC<0:m> and the variable power source VBC. The clock driver 620 may adjust the duty ratio of the plurality of internal clocks ICLK<0:3>, which are generated by the memory 62, by changing the delay amount and the power source of the clock driver 620 in response to the variable delay code VDLC<0:m> and the variable power source VBC. The electronic system 6 may perform a training operation on the plurality of internal clocks ICLK<0:3> using the error detection code EDC, which is different from the systems 2, 3, 4, and 5 described above with reference to FIGS. 2 to 11. Therefore, the electronic system 6 may adjust the duty ratio of the plurality of internal clocks ICLK<0:3> using the error detection code EDC while the electronic system 6 performs another training operation using the data.

Figure 13:
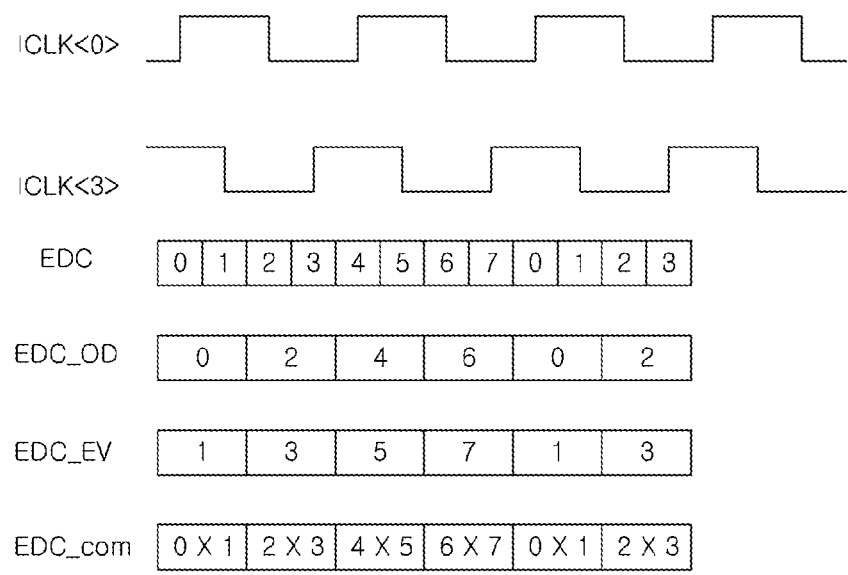
FIG. 13 is a data-timing diagram illustrating an operation of an electronic system shown in FIG. 12.

FIG. 13 is a data-timing diagram illustrating an operation of the electronic system 6 shown in FIG. 12. Referring to FIG. 13, the EDC output portion 690 of the memory 62 may synchronize the data error detection information EDATA with the plurality of internal clocks ICLK<0:3>, and may output the synchronized data error detection information EDATA as the error detection code EDC to the memory controller 61. Therefore, the memory 62 may sequentially output the zeroth to seventh and zeroth to third error detection code EDC to the memory controller 61 in synchronization with the edges of the plurality of internal clocks ICLK<0:3>.

When the EDC output portion 690 outputs the odd-ordered data error detection information in response to the even-odd flag EV_OD_FALG, the zeroth, second, fourth, sixth, zeroth, and second data error detection information EDC_OD may be sequentially transmitted, and the zeroth, second, fourth, sixth, zeroth, and second data error detection information EDC_OD may have substantially the same duty ratio as the plurality of internal clocks ICLK<0:3>.

When the EDC output portion 690 outputs the even-ordered data error detection information in response to the even-odd flag EV_OD_FALG, the first, third, fifth, seventh, first, and third data error detection information EDC_EV may be sequentially transmitted, and the first, third, fifth, seventh, first, and third data error detection information EDC_EV may have substantially the same duty ratio as the plurality of internal clocks ICLK<0:3>.

Therefore, the duty detection section 632 may adjust the duty ratio of the plurality of internal clocks ICLK<0:3> by detecting the duty ratio of the error detection code EDC, which is substantially the same as the duty ratio of the plurality of internal clocks ICLK<0:3>, and by generating the variable delay code VDLC<0:m> and the variable power source VBC.

In an embodiment of the present disclosure, the EDC output portion 690 may combine the odd-ordered and the even-ordered data error detection information EDATA, and may output the combined data error detection information EDATA instead of outputting the odd-ordered or the even-ordered data error detection information. For example, the EDC output portion 690 may output a combined error detection code EDC_com, which is combined through XOR operation to the odd-ordered data error detection information and the even-ordered data error detection information, to the memory controller 61. The EDC output portion 690 may output the data error detection information, which corresponds to a half (½) of the total data error detection information EDATA, as the error detection code EDC by combining the odd-ordered data error detection information and the even-ordered data error detection information, and by outputting the combined information. Therefore, the combined error detection code EDC_com may have substantially the same duty ratio as the plurality of internal clocks ICLK<0:3>. As described above, the transmission of the combined error detection code EDC_com may allow the electronic system 6 to adjust the duty ratio of the plurality of internal clocks ICLK<0:3> only using the error detection code EDC while the electronic system 6 performs another training operation between the memory controller 61 and the memory 62 using the data.

While certain embodiments have been described above, it will be understood to those skilled in the art that the embodiments described are by way of example only. Accordingly, the electronic system generating multi-phase clocks and the training method thereof should not be limited based on the described embodiments. Rather, the electronic system generating multi-phase clocks and the training method thereof described herein should only be limited in light of the claims that follow when taken in conjunction with the above description and accompanying drawings.

What is claimed is:

1. An electronic system comprising:
   a memory controller configured to generate a plurality of controller clocks having different phases from one another based on a reference clock signal, and to transmit a first clock and a second clock having phase difference from each other between the plurality of controller clocks, the phase difference between the first clock and the second clock is 90 or 270 degrees; and
   a memory configured to generate a plurality of internal clocks having different phases from one another by receiving the first clock and the second clock, and selectively output a plurality of odd-ordered data or a plurality of even-ordered data among a plurality of data in synchronization with the plurality of internal clocks,
   wherein the memory comprises:
      a clock receiver configured to generate a first differential clock and a second differential clock in response to the first and second clocks;
      a duty cycle correction portion configured to correct duty ratios of the first differential clock and the second differential clock;
      a clock division portion configured to output the first and second groups of clocks by dividing an output of the duty cycle correction portion; and
      a data input/output portion configured to transmit the plurality of the odd-ordered data or the plurality of the even-ordered data to the memory controller in response to the first group of clocks and an even-odd flag signal.

2. The electronic system of claim 1, wherein the memory controller comprises:
   a clock generation portion configured to generate the plurality of controller clocks based on the reference clock signal;
   a clock driver configured to output the first and second clocks by driving two or more controller clocks among the plurality of controller clocks; and
   a training portion configured to control the clock driver based on the data outputted from the memory.

3. The electronic system of claim 2, wherein the clock driver comprises:
   a variable delay section configured to delay the two or more controller clocks among the plurality of controller clocks in response to a variable delay code; and
   a buffering section configured to generate the first and second clocks by driving an output of the variable delay section in response to a variable power source.

4. The electronic system of claim 3, wherein the training portion comprises a duty detection section configured to generate the variable delay code, and the variable power source by detecting a duty ratio of the data.

5. The electronic system of claim 1, wherein the memory comprises:
   a clock receiver configured to generate the plurality of internal clocks in response to the first and second clocks; and
   a data input/output portion configured to transmit the plurality of the odd-ordered data or the plurality of the even-ordered data to the memory controller in response to the plurality of internal clocks and an even-odd flag signal.

6. The electronic system of claim 5, wherein the data outputted from the data input/output portion have same duty ratio as the plurality of internal clocks.

7. An electronic system comprising:
   a memory controller configured to generate a plurality of controller clocks having different phases from one another based on a reference clock signal, and to transmit a first clock signal and a second clock signal having phase difference from each other between the plurality of controller clocks, the phase difference between the first clock and the second clock is 90 or 270 degrees; and
   a memory configured to generate a first group of clocks and a second group of clocks having different phases from one another by receiving the first clock and the second clock, and selectively output a plurality of odd-ordered data or a plurality of even-ordered data in synchronization with one of the first group of clocks and the second group of clocks,
   wherein the memory comprises:
      a clock receiver configured to generate a first differential clock and a second differential clock in response to the first and second clocks;
      a duty cycle correction portion configured to correct duty ratios of the first differential clock and the second differential clock;
      a clock division portion configured to output the first and second groups of clocks by dividing an output of the duty cycle correction portion; and
      a data input/output portion configured to transmit the plurality of the odd-ordered data or the plurality of the even-ordered data to the memory controller in response to the first group of clocks and an even-odd flag signal.

8. The electronic system of claim 7, wherein the memory controller comprises:
   a clock generation portion configured to generate the plurality of controller clocks based on the reference clock signal;
   a clock driver configured to output the first and second clocks by driving two or more controller clocks among the plurality of controller clocks; and
   a training portion configured to control the clock driver based on the data outputted from the memory.

9. The electronic system of claim 8, wherein the clock driver comprises:

a variable delay section configured to delay the two or more controller clocks among the plurality of controller clocks in response to a variable delay code; and a buffering section configured to generate the first and second clocks by driving an output of the variable delay section in response to a variable power source.

10. The electronic system of claim 9, wherein the training portion comprises a duty detection section configured to generate the variable delay code, and the variable power source by detecting a duty ratio of the data.

11. The electronic system of claim 7, wherein the memory comprises:
   a clock receiver configured to generate the plurality of internal clocks in response to the first and second clocks;
   a clock division portion configured to output the first and second groups of clocks by dividing the plurality of internal clocks; and
   a data input/output portion configured to receive the first group of clocks, and transmit the plurality of the odd-ordered data or the plurality of the even-ordered data to the memory controller in response to the first group of clocks and an even-odd flag signal.

12. The electronic system of claim 11, wherein the data outputted from the data input/output portion have same duty ratio as the plurality of internal clocks.

13. The electronic system of claim 11, wherein the memory further comprises a clock switching portion configured to output the second group of clocks to the input node of the data input/output portion in response to an output control signal.

14. The electronic system of claim 7, wherein the data outputted from the data input/output portion have substantially the same duty ratio as the first and second groups of clocks.

15. The electronic system of claim 7, wherein the memory further comprises a clock switching portion configured to output the second group of clocks to the data input/output portion in response to a switch control signal.

* * * * *